United States Patent
Dogen et al.

(10) Patent No.: US 10,208,164 B2
(45) Date of Patent: Feb. 19, 2019

(54) CURABLE SILICONE COMPOSITION, CURABLE HOT-MELT SILICONE, AND OPTICAL DEVICE

(71) Applicant: Dow Corning Toray Co., Ltd., Tokyo (JP)

(72) Inventors: Ryota Dogen, Chiba (JP); Haruna Yamazaki, Chiba (JP); Makoto Yoshitake, Chiba (JP)

(73) Assignee: Dow Corning Toray Co., Ltd., Tokyo (JP)

( * ) Notice: Subject to any disclaimer, the term of this patent is extended or adjusted under 35 U.S.C. 154(b) by 34 days.

(21) Appl. No.: 15/506,834

(22) PCT Filed: Aug. 26, 2015

(86) PCT No.: PCT/JP2015/004292
§ 371 (c)(1),
(2) Date: Feb. 27, 2017

(87) PCT Pub. No.: WO2016/035285
PCT Pub. Date: Mar. 10, 2016

(65) Prior Publication Data
US 2017/0253700 A1 Sep. 7, 2017

(30) Foreign Application Priority Data
Sep. 1, 2014 (JP) .................. 2014-177557

(51) Int. Cl.
| | | |
|---|---|---|
| C08G 77/04 | (2006.01) | |
| H01L 23/29 | (2006.01) | |
| H01L 23/31 | (2006.01) | |
| H01L 33/52 | (2010.01) | |
| H01L 33/56 | (2010.01) | |
| C09D 183/04 | (2006.01) | |
| C08G 77/12 | (2006.01) | |
| C08G 77/16 | (2006.01) | |
| C08G 77/20 | (2006.01) | |
| C08L 83/04 | (2006.01) | |
| C08G 77/00 | (2006.01) | |

(52) U.S. Cl.
CPC ............. *C08G 77/04* (2013.01); *C08G 77/12* (2013.01); *C08G 77/16* (2013.01); *C08G 77/20* (2013.01); *C08G 77/70* (2013.01); *C08L 83/04* (2013.01); *C09D 183/04* (2013.01); *H01L 23/29* (2013.01); *H01L 23/31* (2013.01); *H01L 33/52* (2013.01); *H01L 33/56* (2013.01); *C08G 77/80* (2013.01); *H01L 2924/0002* (2013.01)

(58) Field of Classification Search
CPC ......... C08G 77/12; C08G 77/20; C08G 77/80
See application file for complete search history.

(56) References Cited

U.S. PATENT DOCUMENTS

| | | | |
|---|---|---|---|
| 3,996,195 A | 12/1976 | Sato et al. | |
| 4,840,693 A | 6/1989 | Suzuki et al. | |
| 2005/0212008 A1 | 9/2005 | Miyoshi | |
| 2008/0308828 A1 | 12/2008 | Kashiwagi et al. | |
| 2009/0179180 A1 | 7/2009 | Morita et al. | |
| 2011/0092647 A1 | 4/2011 | Morita et al. | |
| 2011/0112268 A1 | 5/2011 | Katayama | |
| 2011/0248312 A1 | 10/2011 | Katayama | |
| 2013/0125365 A1 | 5/2013 | Goto et al. | |
| 2015/0183960 A1* | 7/2015 | Yamazaki ............... | H01L 33/60 524/866 |

FOREIGN PATENT DOCUMENTS

| | | | |
|---|---|---|---|
| JP | S6429482 A | | 1/1989 |
| JP | 2004186168 A | | 7/2004 |
| JP | 2008001828 A | | 1/2008 |
| JP | 2009235368 A | | 10/2009 |
| JP | 2009242627 A | | 10/2009 |
| JP | 2010508377 A | | 3/2010 |
| JP | 2011099075 A | | 5/2011 |
| JP | 2011219597 A | | 11/2011 |
| WO | WO2007099863 A1 | | 9/2007 |
| WO | WO2008027280 A2 | | 3/2008 |
| WO | WO2011102272 A1 | | 8/2011 |
| WO | 2012 173167 | * | 12/2012 |
| WO | 2014 002918 | * | 1/2014 |

OTHER PUBLICATIONS

PCT/JP2015/004292 International Search Report dated Sep. 29, 2015, 5 pages.

* cited by examiner

*Primary Examiner* — Kuo Liang Peng

(74) *Attorney, Agent, or Firm* — Warner Norcross & Judd LLP (57) ABSTRACT

A curable silicone composition comprises: (A) an organopolysiloxane represented by a specific average unit formula; optionally, (B) an organopolysiloxane represented by a specific average unit formula; (C) an organohydrogenpolysiloxane represented by a specific average composition formula; and (D) a hydrosilylation catalyst. A curable hot-melt silicone is obtained by subjecting the curable silicone composition to a hydrosilylation reaction to a degree that does not form a cured product. The curable hot-melt silicone is non-flowable at 25° C. and has a melt viscosity at 100° C. of 5000 Pa·s or less. The curable silicone composition provides a cured product having excellent heat resistance and light resistance after being cured. The curable hot-melt silicone is non-flowable at room temperature, has low surface stickiness, and is readily melted by heating.

14 Claims, 3 Drawing Sheets

CURABLE SILICONE COMPOSITION, CURABLE HOT-MELT SILICONE, AND OPTICAL DEVICE

CROSS-REFERENCE TO RELATED APPLICATIONS

This application is the National Stage of International Application No. PCT/JP2015/004292 filed on 26 Aug. 2015, which claims priority to and all advantages of Japanese Patent Application No. 2014-177557 filed on 1 Sep. 2014, the content of which is hereby incorporated by reference

TECHNICAL FIELD

The present invention relates to a curable silicone composition, a curable hot-melt silicone, and an optical device.

BACKGROUND ART

Curable silicone compositions have been used in a wide range of industrial fields since the silicone compositions cure to form cured products having excellent heat resistance, cold resistance, electrical insulating properties, weatherability, water repellency, and transparency. In particular, the cured products thereof are less likely to be discolored and cause less degradation of physical properties compared to other organic materials. Therefore, the cured products are suitable as optical materials. For example, Patent Document 1 proposes a liquid silicone resin composition for light emitting diode (LED) elements, the liquid silicone resin composition comprising: an alkenyl group-containing silicone resin; a silicon atom-bonded hydrogen atom-containing organopolysiloxane; and a hydrosilylation catalyst.

On the other hand, in recent years, a material that is solid or semisolid at room temperature for a production process of a novel light emitting diodes (LEDs) has been proposed. For example, Patent Document 2 describes a sheet-like silicone resin composition for light emitting diodes (LEDs), the sheet-like silicone resin composition comprising: an alkenyl group-containing silicone resin; a silicon atom-bonded hydrogen atom-containing organopolysiloxane; and a hydrosilylation catalyst. Patent Document 3 describes a curable organopolysiloxane composition comprising: a solvent-soluble alkenyl group-containing organopolysiloxane formed by a hydrosilylation reaction of an alkenyl group-containing organopolysiloxane and a silicon atom-bonded hydrogen atom-containing organopolysiloxane; a silicon atom-bonded hydrogen atom-containing organopolysiloxane; and a hydrosilylation catalyst. Patent Document 4 describes a silicone resin sheet obtained by semi-curing a silicone resin composition comprising: an organopolysiloxane having at least two alkenylsilyl groups in a molecule; an organopolysiloxane having at least two hydrosilyl groups in a molecule; a hydrosilylation catalyst; and a reaction inhibitor.

However, these materials have problems of surface stickiness at 25° C. and insufficient hot-melt properties, and thus are not satisfactory for practical applications. Furthermore, as LED packages with higher brightness are realized, these materials have problems of insufficient heat resistance/light resistance although further heat resistance/light resistance has been demanded.

CITATION LIST

Patent Literature

Patent Document 1: Japanese Unexamined Patent Application Publication No. 2004-186168A
Patent Document 2: Japanese Unexamined Patent Application Publication No. 2009-235368A
Patent Document 3: Japanese Unexamined Patent Application Publication No. 2009-242627A
Patent Document : Japanese Unexamined Patent Application Publication No. 2011-219597A

SUMMARY OF INVENTION

Technical Problem

An object of the present invention is to provide a curable silicone composition that provides a cured product having excellent heat resistance and light resistance after being cured, and a curable hot-melt silicone that is non-flowable at room temperature, has low surface stickiness, and is readily melted by heating. Another object of the present invention is to provide an optical device with high reliability.

Solution to Problem

The curable silicone composition of the present invention comprises:
(A) 100 parts by mass of an organopolysiloxane represented by the average unit formula:

$$(R^1{}_3SiO_{1/2})_a(R^2{}_2SiO_{2/2})_b(R^3SiO_{3/2})_c(SiO_{4/2})_d(R^4O_{1/2})_e$$

wherein, $R^1$, $R^2$, and $R^3$ are the same or different and are each a phenyl group, an alkyl group having from 1 to 6 carbons, or an alkenyl group having from 2 to 6 carbons; provided that, 40 mol % or less of $R^1$, 30 mol % or greater of $R^2$, and 10 mol % or less of $R^3$ are alkenyl groups; 30 to 60 mol % of the total of $R^1$, $R^2$, and $R^3$ are phenyl groups; $R^4$ is a hydrogen atom or an alkyl group having from 1 to 6 carbons; "a" is a number of 0 to 0.2, "b" is a number of 0.2 to 0.5, "c" is a number of 0.3 to 0.8, "d" is a number of 0 to 0.5, "e" is a number of 0 to 0.1, "c+d" is a number of 0.3 to 0.8, and "a+b+c+d" is 1;
(B) from 0 to 150 parts by mass of an organopolysiloxane represented by the average unit formula:

$$(R^5{}_3SiO_{1/2})_f(R^5{}_2SiO_{2/2})_g(R^5SiO_{3/2})_h(SiO_{4/2})_i(R^6O_{1/2})_j$$

wherein, $R^5$ are the same or different and are each a phenyl group, an alkyl group having from 1 to 6 carbons, or an alkenyl group having from 2 to 6 carbons; provided that, 10 to 70 mol % of all $R^5$ are phenyl groups, and at least one of all $R^5$ is an alkenyl group; $R^6$ is a hydrogen atom or an alkyl group having from 1 to 6 carbons; "f" is a number of 0.01 to 0.3, "g" is a number of 0.4 to 0.99, "h" is a number of 0 to 0.2, "i" is a number of 0 to 0.2, "j" is a number of 0 to 0.1, "h+i" is a number of 0 to 0.2, and "f+g+h+i" is 1;
(C) an organohydrogenpolysiloxane represented by the average composition formula:

$$R^7{}_kH_lSiO_{(4-k-l)/2}$$

wherein, $R^7$ is a phenyl group or an alkyl group having from 1 to 6 carbons; provided that, 10 to 70 mol % of all $R^7$ are phenyl groups; "k" is a number of 1.0 to 2.5, "l" is a number of 0.01 to 0.9, and "k+l" is a number of 1.5 to 3.0, in an amount such that silicon atom-bonded hydrogen atoms in the present component are from 0.5 to 2.0 mol per 1 mol of the total alkenyl groups in components (A) and (B); and
(D) a hydrosilylation catalyst in an amount sufficient to accelerate hydrosilylation reaction of the present composition.

The curable hot-melt silicone of the present invention is non-flowable at 25° C. and has a melt viscosity at 100° C.

of 5000 Pa·s or less, and the curable hot melt silicon is formed by subjecting a curable silicone composition comprising:

(A) 100 parts by mass of an organopolysiloxane represented by the average unit formula:

$$(R^1_3SiO_{1/2})_a(R^2_2SiO_{2/2})_b(R^3SiO_{3/2})_c(SiO_{4/2})_d(R^4O_{1/2})_e$$

wherein, $R^1$, $R^2$, and $R^3$ are the same or different and are each a phenyl group, an alkyl group having from 1 to 6 carbons, or an alkenyl group having from 2 to 6 carbons; provided that, 40 mol % or less of $R^1$, 30 mol % or greater of $R^2$, and 10 mol % or less of $R^3$ are alkenyl groups; 30 to 60 mol % of the total of $R^1$, $R^2$, and $R^3$ are phenyl groups; $R^4$ is a hydrogen atom or an alkyl group having from 1 to 6 carbons; "a" is a number of 0 to 0.2, "b" is a number of 0.2 to 0.5, "c" is a number of 0 to 0.8, "d" is a number of 0 to 0.5, "e" is a number of 0 to 0.1, "c+d" is a number of 0.3 to 0.8, and "a+b+c+d" is 1;

(B) from 0 to 40 parts by mass of an organopolysiloxane represented by the average unit formula:

$$(R^5_3SiO_{1/2})_f(R^5_2SiO_{2/2})_g(R^5SiO_{3/2})_h(SiO_{4/2})_i(R^6O_{1/2})_j$$

wherein, $R^5$ are the same or different and are each a phenyl group, an alkyl group having from 1 to 6 carbons, or an alkenyl group having from 2 to 6 carbons; however, 10 to 70 mol % of all $R^5$ are phenyl groups, and at least one of all $R^5$ is an alkenyl group; $R^6$ is a hydrogen atom or an alkyl group having from 1 to 6 carbons; "f" is a number of 0.01 to 0.3, "g" is a number of 0.4 to 0.99, "h" is a number of 0 to 0.2, "i" is a number of 0 to 0.2, "j" is a number of 0 to 0.1, "h+i" is a number of 0 to 0.2, and "f+g+h+i" is 1;

(C) an organohydrogenpolysiloxane represented by the average composition formula:

$$R^7_kH_lSiO_{(4-k-l)/2}$$

wherein, $R^7$ is a phenyl group or an alkyl group having from 1 to 6 carbons; however, 10 to 70 mol % of all $R^7$ are phenyl groups; "k" is a number of 1.0 to 2.5, "l" is a number of 0.01 to 0.9, and "k+l" is a number of 1.5 to 3.0, in an amount such that silicon atom-bonded hydrogen atoms in the present component is from 0.5 to 2.0 mol per 1 mol of the total alkenyl groups in components (A) and (B); and (D) a hydrosilylation catalyst in an amount sufficient to accelerate hydrosilylation reaction of the present composition;

to a hydrosilylation reaction to a degree that does not form a cured product.

Furthermore, the optical device of the present invention has an optical semiconductor element encapsulated, protected, or covered with a cured product of the curable silicone composition described above or the curable hot-melt silicone described above.

Effects of Invention

The curable silicone composition of the present invention provides a cured product having excellent heat resistance and light resistance after being cured. Furthermore, the curable hot-melt silicone of the present invention is non-flowable at room temperature, has low surface stickiness, and is readily melted by heating. Furthermore, the optical device of the present invention has excellent reliability and long life.

DESCRIPTION OF EMBODIMENTS

First, the curable silicone composition of the present invention will be described in detail.

Component (A) is an organopolysiloxane represented by the average unit formula:

$$(R^1_3SiO_{1/2})_a(R^2_2SiO_{2/2})_b(R^3SiO_{3/2})_c(SiO_{4/2})_d(R^4O_{1/2})_e$$

In the formula, $R^1$, $R^2$, and $R^3$ are the same or different and are each a phenyl group, an alkyl group having from 1 to 6 carbons, or an alkenyl group having from 2 to 6 carbons. Examples of the alkyl group include a methyl group, an ethyl group, a propyl group, a butyl group, a pentyl group, a hexyl group, a cyclopentyl group, and a cyclohexyl group. Among these, a methyl group is preferred. Furthermore, examples of the alkenyl group include a vinyl group, an allyl group, a butenyl group, a pentenyl group, and a hexenyl group. Among these, a vinyl group and an allyl group are preferred.

Note that 40 mol % or less of $R^1$, 30 mol % or greater of $R^2$, and 10 mol % or less of $R^3$ are alkenyl groups, 30 to 60 mol % of the total of $R^1$, $R^2$, and $R^3$ are phenyl groups. Furthermore, from the perspectives of achieving sufficiently high mechanical strength and obtaining a cured product having excellent heat resistance and light resistance, preferably, 35 mol % or less of $R^1$, 35 mol % or greater of $R^2$, and 5 mol % or less of $R^3$ are alkenyl groups, and 35 to 55 mol % of the total of $R^1$, $R^2$, and $R^3$ are phenyl groups. Furthermore, since a curable hot-melt silicone that is non-flowable at room temperature, that has low surface stickiness, and that is readily melted by heating can be easily prepared using the present composition, preferably, 10 mol % or less of $R^1$, 45 mol % or greater of $R^2$, and 10 mol % or less of $R^3$ are alkenyl groups, and 35 to 55 mol % of the total of $R^1$, $R^2$, and $R^3$ are phenyl groups.

In the formula, $R^4$ is a hydrogen atom or an alkyl group having from 1 to 6 carbons. Examples of the alkyl group include alkyl groups that are similar to those described above; however, the alkyl group is preferably a methyl group or an ethyl group.

In the formula, "a" is a number in a range from 0 to 0.2; "b" is a number in a range from 0.2 to 0.5; "c" is a number in a range from 0.3 to 0.8; "d" is a number in a range from 0 to 0.5; "e" is a number in a range from 0 to 0.1; "c+d" is a number in a range from 0.3 to 0.8; and "a+b+c+d" is 1. Furthermore, from the perspectives of achieving sufficiently high mechanical strength and obtaining a cured product having excellent heat resistance and light resistance, "a" is preferably a number in a range from 0 to 0.10; "b" is preferably a number in a range from 0.2 to 0.4; "c" is preferably a number in a range from 0.4 to 0.8; "d" is preferably a number in a range from 0 to 0.3; "e" is preferably a number in a range from 0 to 0.05; "c+d" is preferably a number in a range from 0.4 to 0.8; and "a+b+ c+d" is 1. Furthermore, since a curable hot-melt silicone that is non-flowable at room temperature, that has low surface stickiness, and that is readily melted by heating can be easily prepared using the present composition, "a" is preferably a number in a range from 0 to 0.10; "b" is preferably a number in a range from 0.2 to 0.4; "c" is preferably a number in a range from 0.5 to 0.8; "d" is preferably a number in a range from 0 to 0.2; "e" is preferably a number in a range from 0 to 0.05; "c+d" is preferably a number in a range from 0.5 to 0.8; and "a+b+c+d" is 1.

Examples of this type of component (A) include organopolysiloxanes such as those mentioned below. Note that, in the formulas, Me represents a methyl group, Ph represents a phenyl group, and Vi represents a vinyl group.

$(ViMeSiO_{2/2})_{0.25}(PhSiO_{3/2})_{0.75}(HO_{1/2})_{0.02}$ $(ViMeSiO_{2/2})_{0.30}(PhSiO_{3/2})_{0.70}(HO_{1/2})_{0.01}$ $(Me_3SiO_{1/2})_{0.15}(MeViSiO_{2/2})_{0.25}(PhSiO_{3/2})_{0.60}(HO_{1/2})_{0.04}$ $(Me_3SiO_{1/2})_{0.15}(MeViSiO_{2/2})_{0.25}(PhSiO_{3/2})_{0.60}(HO_{1/2})_{0.04}$ $(Me_3SiO_{1/2})_{0.05}(MeViSiO_{2/2})_{0.28}(PhSiO_{3/2})_{0.67}(HO_{1/2})_{0.04}$ $(Me_3SiO_{1/2})_{0.02}(MeViSiO_{2/2})_{0.28}(PhSiO_{3/2})_{0.70}(HO_{1/2})_{0.04}$ $(Me_2ViSiO_{1/2})_{0.03}(MeViSiO_{2/2})_{0.27}(PhSiO_{3/2})_{0.70}(HO_{1/2})_{0.04}$ $(Me_3SiO_{1/2})_{0.05}(MeViSiO_{2/2})_{0.30}(PhSiO_{3/2})_{0.45}(SiO_{4/2})_{0.20}(HO_{1/2})_{0.04}$

Component (B) is an optional component to adjust the viscosity of the present composition and to adjust hardness and mechanical strength of the resulting cured product and is an organopolysiloxane represented by the average unit formula:

$(R^5{}_3SiO_{1/2})_f(R^5{}_2SiO_{2/2})_g(R^5SiO_{3/2})_h(SiO_{4/2})_i(R^6O_{1/2})_j.$

In the formula, $R^5$ are the same or different and are each a phenyl group, an alkyl group having from 1 to 6 carbons, or an alkenyl group having from 2 to 6 carbons. Examples of the alkyl group include similar alkyl groups described above, and the alkyl group is preferably a methyl group. Examples of the alkenyl group include similar alkenyl groups described above, and the alkenyl group is preferably a vinyl group or an allyl group. Note that, in the formula, although 10 to 70 mol % of all $R^5$ are phenyl groups, since sufficiently high mechanical strength is achieved and a cured product having excellent heat resistance and light resistance is obtained and since a curable hot-melt silicone that is non-flowable at room temperature, that has low surface stickiness, and that is readily melted by heating can be easily prepared using the present composition, 20 to 60 mol % of all $R^5$ are preferably phenyl groups.

Furthermore, in the formula, $R^6$ is a hydrogen atom or an alkyl group. Examples of the alkyl group include alkyl groups that are similar to those of $R^4$ described above, and a methyl group and an ethyl group are preferred.

Furthermore, in the formula, "f" is a number in a range from 0.01 to 0.3, "g" is a number in a range from 0.4 to 0.99, "h" is a number in a range from 0 to 0.2, "i" is a number in a range from 0 to 0.2, "j" is a number in a range from 0 to 0.1, "h+i" is a number in a range from 0 to 0.2, and "f+g+h+i" is 1.

Examples of this type of component (B) include organopolysiloxanes such as those mentioned below. Note that, in the formulas, Me represents a methyl group, Ph represents a phenyl group, and Vi represents a vinyl group.

$ViMe_2SiO(SiMePhO)_{18}SiMe_2Vi$, that is $(ViMe_2SiO_{1/2})_{0.10}(MePhSiO_{2/2})_{0.90}$ $ViMe_2SiO(SiMe_2O)_{20}(SiPh_2O)_8SiMe_2Vi$, that is $(ViMe_2SiO_{1/2})_{0.10}(Me_2SiO_{2/2})_{0.50}(Ph_2SiO_{2/2})_{0.40}$ $(ViMe_2SiO_{1/2})_{0.10}(MePhSiO_{2/2})_{0.80}(PhSiO_{3/2})_{0.10}(HO_{1/2})_{0.02}$ $(ViMe_2SiO_{1/2})_{0.20}(MePhSiO_{2/2})_{0.70}(SiO_{4/2})_{0.10}(HO_{1/2})_{0.01}$ In the present composition, the content of component (B) is in a range from 0 to 150 parts by mass per 100 parts by mass of component (A). Furthermore, from the perspectives of achieving sufficiently high mechanical strength and obtaining a cured product having excellent heat resistance and light resistance, the content is preferably in a range from 0 to 120 parts by weight, in a range from 0 to 100 parts by weight, or in a range from 0 to 40 parts by weight.

Furthermore, when a curable hot-melt silicone is prepared using the present composition, the content of component (B) is in a range from 0 to 40 parts by mass per 100 parts by mass of component (A). Furthermore, since a curable hot-melt silicone that is non-flowable at room temperature, that has low surface stickiness, and that is readily melted by heating can be prepared, the content is preferably in a range from 0 to 30 parts by mass.

Component (C) is to crosslink components (A) and (B) and is an organohydrogenpolysiloxane represented by the average composition formula:

$R^7{}_kH_lSiO_{(4-k-l)/2}.$

In the formula, $R^7$ is a phenyl group or an alkyl group having from 1 to 6 carbons. Examples of the alkyl group include similar alkyl groups described above, and the alkyl group is preferably a methyl group. Note that, in component (B), 10 to 70 mol % of all $R^7$ are phenyl groups.

Furthermore, in the formula, "k" is a number in a range from 1.0 to 2.5, "l" is a number in a range from 0.01 to 0.9, and "k+l" is a number in a range from 1.5 to 3.0. Furthermore, from the perspectives of achieving sufficiently high mechanical strength and obtaining a cured product having excellent heat resistance and light resistance, "k" is preferably a number in a range from 1.2 to 2.3, "l" is preferably a number in a range from 0.1 to 0.8, and "k+l" is preferably a number in a range from 2.0 to 2.7. Furthermore, since a curable hot-melt silicone that is non-flowable at room temperature, that has low surface stickiness, and that is readily melted by heating can be easily prepared using the present composition, "k" is preferably a number in a range from 1.5 to 2.2, "l" is preferably a number in a range from 0.1 to 0.8, and "k+l" is preferably a number in a range from 2.0 to 2.7.

Examples of this type of component (C) include organopolysiloxanes such as those mentioned below. Note that, in the formulas, Me represents a methyl group, and Ph represents a phenyl group.

$Ph_2Si(OSiMe_2H)_2$, that is $Ph_{0.67}Me_{1.33}H_{0.67}SiO_{0.67}$ $MePhSi(OSiMe_2H)_2$, that is $Ph_{0.33}Me_{1.67}H_{0.67}SiO_{0.67}$ PhSi(OSiMe$_2$H)$_3$, that is Ph$_{0.25}$Me$_{1.50}$H$_{0.75}$SiO$_{0.75}$ (HMe$_2$SiO$_{1/2}$)$_{0.6}$(PhSiO$_{3/2}$)$_{0.4}$, that is Ph$_{0.40}$Me$_{1.20}$H$_{0.60}$SiO$_{0.90}$ The content of component (C) is an amount such that silicon atom-bonded hydrogen atoms in the present component is in a range from 0.5 to 2.0 mol per 1 mol of the total alkenyl groups in components (A) and (B). Furthermore, from the perspectives of achieving sufficiently high mechanical strength and obtaining a cured product having excellent heat resistance and light resistance, the content is preferably an amount such that silicon atom-bonded hydrogen atoms in the present component is in a range from 0.5 to 1.8 mol. When a curable hot-melt silicone is prepared by using the present composition, the content is preferably an amount such that silicon atom-bonded hydrogen atoms in the present component is in a range from 0.7 to 1.5 mol per 1 mol of total alkenyl groups in components (A) and (B).

Component (D) is a hydrosilylation catalyst for accelerating hydrosilylation reaction of the present composition. Examples of component (D) include platinum-based catalysts, rhodium-based catalysts, and palladium-based catalysts. Platinum-based catalysts are preferred due to the ability to remarkably promote curing of the present composition. Examples of the platinum-based catalyst include a platinum fine powder, chloroplatinic acid, an alcohol solution of chloroplatinic acid, a platinum-alkenylsiloxane complex, a platinum-olefin complex, and a platinum-carbonyl complex, with a platinum-alkenylsiloxane complex being particularly preferred. Examples of the alkenylsiloxane include 1,3-divinyl-1,1,3,3-tetramethyldisiloxane, 1,3,5,7-tetramethyl-1,3,5,7-tetravinylcyclotetrasiloxane, alkenylsiloxanes having part of the methyl groups of these alkenylsiloxane substituted by ethyl groups, phenyl groups, or the like, and alkenylsiloxanes having vinyl groups of these alkenylsiloxane substituted by allyl groups, hexenyl groups, or the like. In particular, 1,3-divinyl-1,1,3,3-tetramethyldisiloxane is preferred due to excellent stability of the platinum-alkenylsiloxane complex.

The added amount of component (D) is an amount that accelerates the hydrosilylation reaction. Specifically, the added amount is preferably an amount that the amount in terms of mass units of the metal atom in the present component is in a range from 0.01 to 500 ppm, more preferably in a range from 0.01 to 100 ppm, particularly preferably in a range from 0.01 to 50 ppm, relative to the total amount of components (A) to (C). This is because, when the added amount of component (D) is greater than or equal to the lower limit of the range described above, the hydrosilylation reaction of the present composition can be sufficiently accelerated. On the other hand, when the added amount is less than or equal to the upper limit of the range described above, problems such as discoloration are less likely to occur in the resulting cured product.

The present composition may contain (E) a reaction inhibitor as an optional component to adjust the curing reaction of the present composition. Examples of component (E) include alkyne alcohols, such as 2-methyl-3-butyn-2-ol, 3,5-dimethyl-1-hexyn-3-ol, and 2-phenyl-3-butyn-2-ol; enyne compounds, such as 3-methyl-3-penten-1-yne and 3,5-dimethyl-3-hexen-1-yne; 1,3,5,7-tetramethyl-1,3,5,7-tetravinylcyclotetrasiloxane, 1,3,5,7-tetramethyl-1,3,5,7-tetrahexenylcyclotetrasiloxane, and benzotriazole. The content of component (E) is not limited; however, the content is preferably in a range from 0.0001 to 5 parts by mass per 100 parts by mass of the total amount of components (A) to (D) described above.

Furthermore, the present composition may contain a phosphor in order to convert the emission wavelength from an optical semiconductor element. Examples of the phosphor include substances widely used in light emitting diodes (LEDs), such as yellow, red, green, and blue light-emitting phosphors, such as oxide-based phosphors, oxynitride-based phosphors, nitride-based phosphors, sulfide-based phosphors, and oxysulfide-based phosphors. Examples of the oxide-based phosphors include yttrium, aluminum, and garnet-type YAG green to yellow light emitting phosphors containing cerium ions; terbium, aluminum, and garnet-type TAG yellow light emitting phosphors containing cerium ions; and silicate green to yellow light emitting phosphors containing cerium or europium ions. Examples of the oxynitride-based phosphors include silicon, aluminum, oxygen, and nitrogen-type SiAlON red to green light-emitting phosphors containing europium ions. Examples of the nitride-based phosphors include calcium, strontium, aluminum, silicon, and nitrogen-type CASN red light-emitting phosphors containing europium ions. Examples of the sulfide-based phosphors include ZnS green light-emitting phosphors containing copper ions or aluminum ions. Examples of the oxysulfide-based phosphors include Y$_2$O$_2$S red light-emitting phosphors containing europium ions. Two or more types of these phosphors may be combined for use.

The present composition may also contain an adhesion-imparting agent for improving the adhesion of the composition. Preferred adhesion-imparting agents are organosilicon compounds having at least one alkoxy group bonded to a silicon atom in a molecule. This alkoxy group is exemplified by a methoxy group, an ethoxy group, a propoxy group, a butoxy group, and a methoxyethoxy group; and the methoxy group is particularly preferred. Furthermore, examples of other groups, excluding the alkoxy group bonded to the silicon atom, of the organosilicon compound include halogen-substituted or unsubstituted monovalent hydrocarbon groups, such as an alkyl group, alkenyl group, aryl group, aralkyl group, and halogenated alkyl group; glycidoxyalkyl groups, such as a 3-glycidoxypropyl group and 4-glycidoxybutyl group; epoxycyclohexylalkyl groups, such as a 2-(3,4-epoxycyclohexyl)ethyl group and 3-(3,4-epoxycyclohexyl)propyl group; epoxyalkyl groups, such as a 3,4-epoxybutyl group and 7,8-epoxyoctyl group; acrylic group-containing monovalent organic groups, such as a 3-methacryloxypropyl group; and a hydrogen atom. The organosilicon compound preferably has a group that can react with an alkenyl group or silicon atom-bonded hydrogen atom in the present composition. Specifically, the organosilicon compound preferably has a silicon atom-bonded hydrogen atom or alkenyl group. Moreover, due to the ability to impart good adhesion to various types of substrates, this organosilicon compound preferably has at least one epoxy group-containing monovalent organic group in a molecule. Examples of such an organosilicon compound include organosilane compounds, organosiloxane oligomers, and alkyl silicates. Examples of the molecular structure of the organosiloxane oligomer or alkyl silicate include linear, partially branched linear, branched, cyclic, and net-shaped structures. It is preferable that the molecular structure be a linear, branched, or net-shaped structure. Examples of this type of organosilicon compound include silane compounds such as 3-glycidoxypropyltrimethoxysilane, 2-(3,4-epoxycyclohexyl)ethyltrimethoxysilane, and 3-methacryloxy propyltrimethoxysilane; siloxane compounds having at least one of silicon atom-bonded alkenyl groups and silicon atom-bonded hydrogen atoms, and at least one silicon atom-bonded alkoxy group in a molecule; mixtures of a silane compound or siloxane compound having at least one silicon atom-bonded alkoxy group and a siloxane compound having at least one silicon atom-bonded hydroxyl group and at least one silicon atom-bonded alkenyl group in a molecule; methyl polysilicate, ethyl polysilicate, and epoxy group-containing ethyl polysilicate. The adhesion-imparting agent is preferably a low-viscosity liquid, and the viscosity is not particularly limited; however, the viscosity at 25° C. is preferably in a range from 1 to 500 mPa·s. Furthermore, in the present composition, the content of the adhesion-imparting agent is not limited but is preferably in a range from 0.01 to 10 parts by mass per 100 parts by mass of the total amount of the present composition.

Furthermore, a silicone component that does not have a silicon atom-bonded hydrogen atom; an inorganic filler, such as silica, titanium oxide, glass, alumina, or zinc oxide; an organic resin fine powder of a polymethacrylate resin or the like; a heat-resistant agent, a dye, a pigment, a flame retardant, and the like may be contained as optional components in the present composition at levels that do not impair the object of the present invention.

Next, the curable hot-melt silicone of the present invention will be described in detail.

The curable hot-melt silicone of the present invention is obtained by subjecting a curable silicone composition comprising: 100 parts by mass of component (A) described above; from 0 to 40 parts by mass of component (B) described above; component (C) described above, in an amount such that silicon atom-bonded hydrogen atoms in the present component is from 0.5 to 2.0 mol per 1 mol of the total alkenyl groups in components (A) and (B); and component (D) in an amount sufficient to accelerate hydrosilylation reaction of the present composition; to a hydrosilylation reaction to a degree that does not form a cured product; and the curable hot-melt silicone is non-flowable at 25° C. and has a melt viscosity at 100° C. of 5000 Pa·s or less.

In the curable silicone composition to prepare the curable hot-melt silicone of the present invention, components (A) to (D) and the other optional components are as described above.

In the hot-melt silicone, "subjecting the curable silicone composition described above to hydrosilylation reaction to a degree that does not form a cured product" means that curing reaction of the curable silicone composition is terminated in the middle of the process. Specifically, the hydrosilylation reaction is preferably proceeded until the time when from 50% to 90% of either one in the smaller amount selected from the alkenyl group or the silicon-bonded hydrogen atoms in the curable silicone composition is consumed, that is, until the time when the degree of conversion in the reaction becomes from 50% to 90%. This degree of conversion can be, for example, determined from the difference in reaction heat using a differential scanning calorimeter (DSC).

The present hot-melt silicone is non-flowable at 25° C. and the melt viscosity at 100° C. is 5000 Pa·s or less, and preferably in a range from 10 to 3500 Pa s. Note that "non-flowable" means not flowing when no load is applied, and indicates the condition at lower than the softening point measured by a testing method for the softening point by the Ring-and-ball method of a hot-melt adhesive agent stipulated in JIS K 6863-1994, "Testing methods for the softening point of hot melt adhesives". That is, in order to be non-flowable at 25° C., the softening point needs to be higher than 25° C. This is because excellent shape retention properties are achieved at the temperature and a curable hot-melt silicone having low surface stickiness can be obtained if the hot-melt silicone is non-flowable at 25° C. Furthermore, when the melt viscosity at 100° C. is within the range described above, after hot melting, a curable hot-melt silicone having excellent adhesion after being cooled to 25° C. can be obtained. Furthermore, the softening point of the present hot melt silicone is higher than 25° C. but is preferably lower than 50° C. That is, the present hot-melt silicone preferably has a melt viscosity at 50° C. of 2000 Pa·s or greater, and the melt viscosity at 50° C. is more preferably equal to or greater than twice the melt viscosity at 100° C., and even more preferably equal to or greater than 25 times the melt viscosity at 100° C. This is because, when the melt viscosity at 50° C. is greater than or equal to the lower limit described above and the melt viscosity at 50° C. relative to the melt viscosity at 100° C. is equal to or greater than the lower limit described above, non-flowability at 25° C., low surface stickiness, and excellent hot-melt properties are exhibited.

The present hot-melt silicone can be processed into various forms and, for example, can be made into a sheet having a thickness of 5 μm to 5 mm, powder form, or tablet form. The obtained hot-melt silicone with various forms can be formed into a cured product having a desired shape by various methods such as, lamination, compression molding, and transfer molding.

Next, the optical device of the present invention will be described.

The optical device of the present invention is characterized in that an optical semiconductor element is encapsulated, protected, or covered with a cured product of the curable silicone composition or the curable hot-melt silicone described above. An example of this optical semiconductor element is a light emitting diode element. Furthermore, an example of such an optical device is a light emitting diode (LED).

The present invention also relates to an optical device provided with a convex cured product. FIGS. 1 to 4 illustrate optical devices having an LED 2 mounted on a substrate 1 having a flat surface, and further provided with a convex cured product 3. The LED 2 and an electrode (not illustrated) on the substrate 1 are connected by a wire or the like (also not illustrated).

Figure 1:
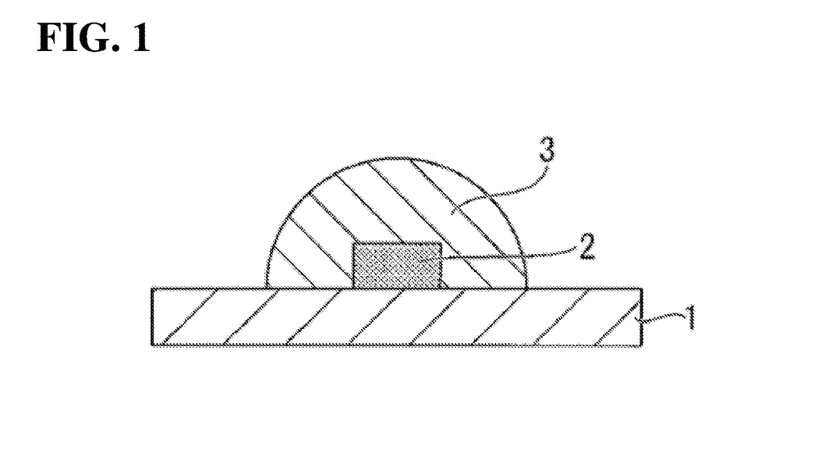
FIG. 1 is a schematic cross-sectional view of one example of an optical device manufactured according to a manufacturing method of the present invention.
Figure 2:
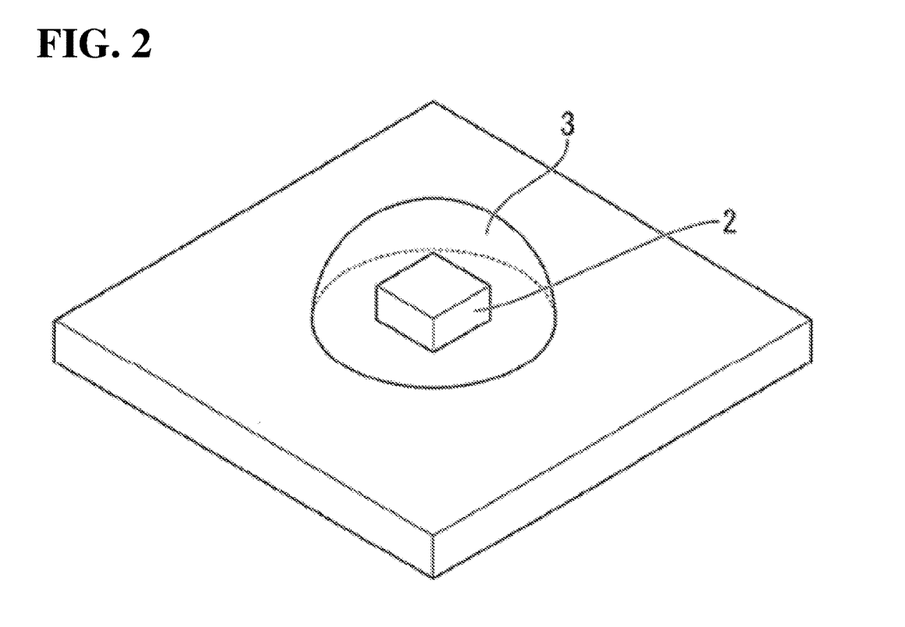
FIG. 2 is a schematic transparent perspective view of the optical device illustrated in FIG. 1.

The optical device according to the present invention illustrated in FIGS. 1 and 2 can be manufactured by depositing the curable silicone composition dropwise upon the substrate 1 so as to cover the LED 2, curing the composition, and forming a convex cured product 3. The convex cured product 3 of the optical device according to the present invention illustrated in FIGS. 1 and 2 is hemispherical, making it possible to control the direction of light projection and to keep head-on brightness from becoming too great, thereby allowing superior optical properties.

Figure 3:
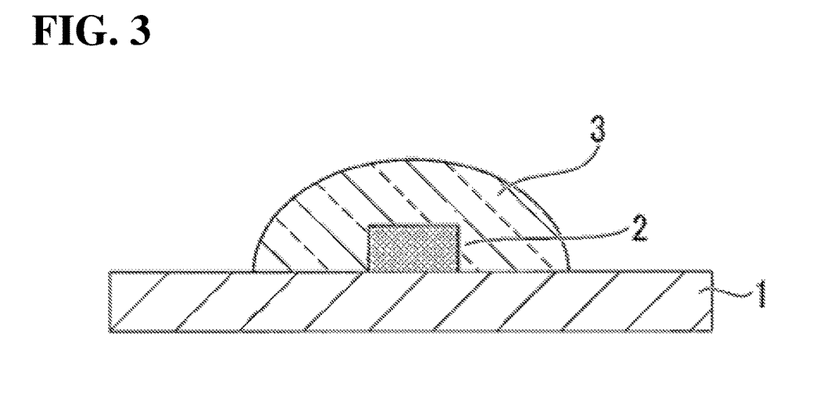
FIG. 3 is a schematic cross-sectional view of another example of an optical device manufactured according to the manufacturing method of the present invention.

FIG. 3 illustrates an optical device provided with a convex cured product 3 having a slightly flattened dome shape, unlike that illustrated in FIG. 1. As in the case of the optical device illustrated in FIGS. 1 and 2, the LED 2 and an electrode (not illustrated) on the substrate 1 are connected by a wire or the like (also not illustrated). The convex cured product 3 of the optical device according to the present invention illustrated in FIG. 3 is slightly flattened, allowing the thickness of the optical device to be kept down.

Figure 4:
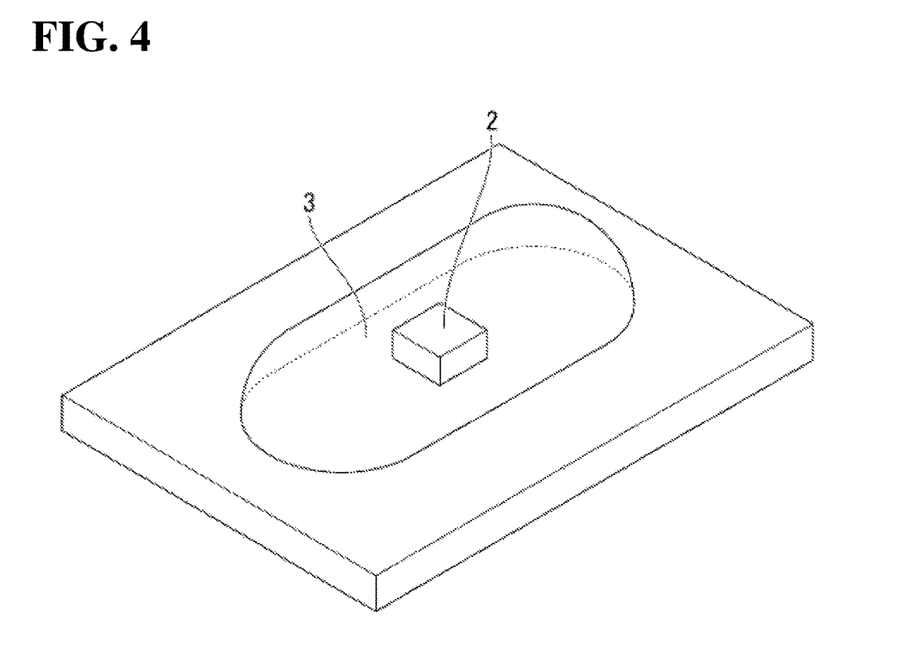
FIG. 4 is a schematic transparent perspective view of another example of an optical device manufactured according to the manufacturing method of the present invention.

FIG. 4 illustrates an optical device provided with a convex cured product 3 having a hemicylindrical shape, unlike that illustrated in FIG. 1. As in the case of the optical device illustrated in FIGS. 1 and 2, the LED 2 and an electrode (not illustrated) on the substrate 1 are connected by a wire or the like (also not illustrated). The convex cured product 3 of the optical device according to the present invention illustrated in FIG. 4 has a hemicylindrical shape, allowing comparatively dense disposition of the convex cured product 3 upon the substrate 1.

In the embodiments illustrated in FIGS. 1 to 4, there is no need to provide, upon the surface of the substrate 1, a dam member (projection) for preventing the spread of the curable silicone composition deposited dropwise upon the surface of the substrate 1. A hemispherical, hemicylindrical, dome-shaped, or similar convex cured product 3 can thus be easily manufactured even if the substrate 1 has a flat surface. Moreover, because there is no need for a dam member for preventing the spread of the curable silicone composition, there is also no need to cut the dam member via dicing in the optical device obtained according to the manufacturing method of the present invention.

Figure 5:
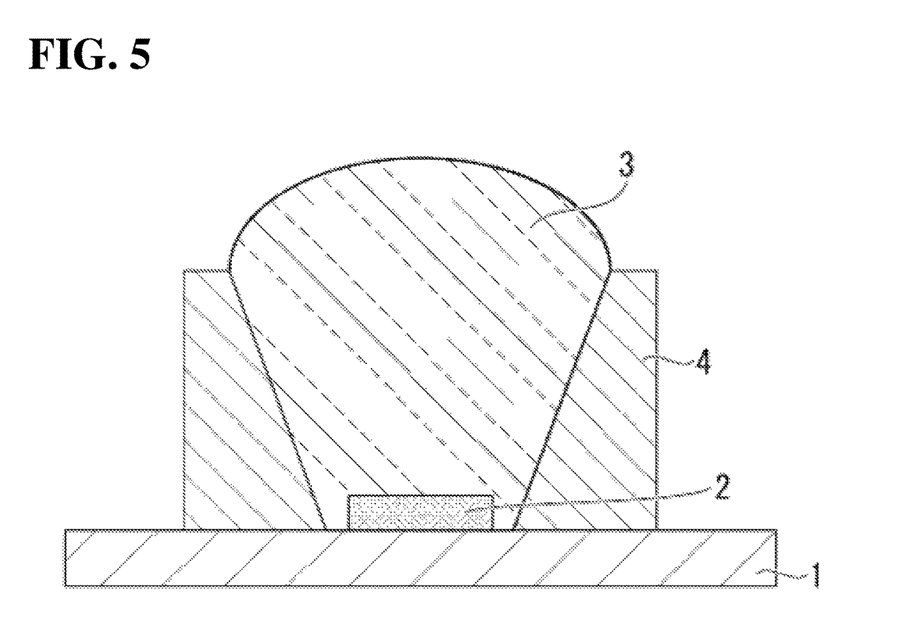
FIG. 5 is a schematic cross-sectional view of another example of an optical device manufactured according to the manufacturing method of the present invention.

Meanwhile, FIG. 5 illustrates an optical device including a reflective member 4 surrounding the LED 2, unlike FIGS. 1 to 4. The optical device according to the present invention illustrated in FIG. 5 is provided with an LED 2 and a reflective member 4 upon the substrate 1, as well as a convex cured product 3. The LED 2 and an electrode (not illustrated) on the substrate 1 are connected by a wire or the like (also not illustrated). The optical device according to the present invention illustrated in FIG. 5 can be manufactured by depositing the curable silicone composition dropwise within the frame of the reflective member 4 so as to cover the LED 2, curing the composition, and forming a convex cured product 3. Conventionally, an optical device similar to that illustrated in FIG. 5 can be manufactured by filling a frame with a sealing material, followed by bonding a lens thereto. However, in the manufacturing method according to the present invention, the process of filling with sealing material and the process of forming the lens can be performed at the same time, allowing the process of manufacturing the optical device to be simplified. In addition, the need to bond the lens and the sealing material is eliminated, allowing reflection of light between the lens and the sealing material to be eliminated.

EXAMPLES

The curable silicone composition, the curable hot-melt silicone, and the optical device of the present invention will be described in detail using examples and comparative examples. The hardness and the degree of discoloration of the cured product of the curable silicone composition, the surface stickiness at 25° C. of the curable hot-melt silicone, the melt viscosities at 50° C. and 100° C., and the degree of conversion in the reaction were measured as described below. Furthermore, in the formulas, Me represents a methyl group, Ph represents a phenyl group, and Vi represents a vinyl group.

Hardness of Cured Product

A sheet-like cured product was produced by subjecting the curable silicone composition to press molding at 180° C. for 1 hour. The hardness of the sheet-like cured product was measured by type D durometer as stipulated in JIS K 6253.

Degree of Discoloration of Cured Product

A test sample having a thickness of 2 mm was produced by maintaining the curable silicone composition at 180° C. for 1 hour to cure. The initial degree of discoloration and the degree of discoloration after being heated at 180° C. for 240 hours of this test sample were measured. The degree of discoloration was measured by a spectrophotometer, and the value of b* used in L*a*b* color space stipulated in JIS Z 8729-1980, "Specification of Colour of Materials according to the CIE 1976 (L*a*b*) Space and the CIE 1976 (L*u*v*) Space", was used as an indicator of the degree of yellow discoloration.

Surface Stickiness of Curable Hot-melt Silicone

The surface stickiness at 25° C. of the curable hot-melt silicone was observed by touching with a finger.

Melt Viscosity of Curable Hot-melt Silicone

The melt viscosities at 50° C. and 100° C. of the curable hot-melt silicone were measured using the AR550 rheometer, manufactured by TA Instruments, using a cone plate with a diameter of 20 mm and a cone angle of 2° at a shear rate of 1/s.

Degree of Conversion in Reaction

For the curable hot-melt silicone and the curable silicone composition which was the raw material of the curable hot-melt silicone, the value of heat of exothermic hydrosilylation reaction was measured using the Differential scanning calorimeters (DSC) XDSC7000, manufactured by Seiko Instruments Inc., and the degree of conversion in the reaction of the curable hot-melt silicone was calculated based on the following equation.

$$\text{Degree of conversion in reaction} = ((X-Y)/X) \times 100 \qquad [\text{Equation 1}]$$

X: Calory measured during curing of the curable silicone composition
Y: Calory measured during curing of the curable hot-melt silicone

Reliability Test of Optical Device

On a ceramic substrate on which an optical semiconductor element is mounted, a dome-like cured product was formed by subjecting the curable silicone composition or the curable hot-melt silicone of the present invention to compression molding at 150° C. for 5 minutes, and then curing in an oven at 150° C. for 2 hours to produce an optical device illustrated in FIG. 1.

Using this optical device, light was emitted by turning on electricity of 700 mA at 85° C. and a relative humidity of 85%. After 100 hours, the optical device was taken out, and the light radiant flux (mW) at which light was emitted by turning on electricity of 30 mA was measured and the retention rate of initial light radiant flux was calculated.

Example 1

A curable silicone composition was prepared by mixing 62.1 parts by mass of organopolysiloxane that contained 7.0 mass % of vinyl group and that was represented by the average unit formula:

$(\text{ViMeSiO}_{2/2})_{0.3}(\text{PhSiO}_{3/2})_{0.7}(\text{HO}_{1/2})_{0.02}$, 10.0 parts by mass of organopolysiloxane that contained 2.0 mass % of vinyl group and that was represented by the average unit formula:

$(\text{ViMe}_2\text{SiO}_{1/2})_{0.10}(\text{PhMeSiO}_{2/2})_{0.90}(\text{HO}_{1/2})_{0.02}$, 27.9 parts by mass of organopolysiloxane that contained 0.60 mass % of silicon atom-bonded hydrogen atom and that was represented by the formula:

$\text{Ph}_2\text{Si}(\text{OSiMe}_2\text{H})_2$ (in an amount that silicon atom-bonded hydrogen atoms in the present component was 1.0 mol per 1 mol of the vinyl groups in the two types of organopolysiloxanes described above), 1,3-divinyl-1,1,3,3-tetramethyldisiloxane solution of platinum-1,3-divinyl-1,1,3,3-tetramethyldisiloxane complex (an amount so that the amount of platinum metal, in terms of mass unit, relative to the amount of the present composition was 1 ppm), and 1-ethynylcyclohexan-1-ol (an amount that was 100 ppm in terms of mass unit relative to the amount of the present composition).

The hardness and the degree of discoloration of the cured product of this curable silicone composition were measured. Furthermore, the reliability test was performed for an optical device produced by using this curable silicone composition. These results are shown in Table 1.

Example 2

A curable silicone composition was prepared by mixing 67.1 parts by mass of organopolysiloxane that contained 6.6 mass % of vinyl group and that was represented by the average unit formula:

$(Me_3SiO_{2/2})_{0.05}(ViMeSiO_{2/2})_{0.28}(PhSiO_{3/2})_{0.67}$
$(HO_{1/2})_{0.02}$, 10.0 parts by mass of organopolysiloxane that contained 2.0 mass % of vinyl group and that was represented by the average unit formula:

$(ViMe_2SiO_{1/2})_{0.10}(PhMeSiO_{2/2})_{0.90}(HO_{1/2})_{0.02}$, 22.9 parts by mass of organopolysiloxane that contained 0.75 mass % of silicon atom-bonded hydrogen atom and that was represented by the formula:

$PhMeSi(OSiMe_2H)_2$ (in an amount that silicon atom-bonded hydrogen atoms in the present component was 1.00 mol per 1 mol of the vinyl groups in the two types of organopolysiloxanes described above), 1,3-divinyl-1,1,3,3-tetramethyldisiloxane solution of platinum-1,3-divinyl-1,1,3,3-tetramethyldisiloxane complex (an amount so that the amount of platinum metal, in terms of mass unit, relative to the amount of the present composition was 1 ppm), and 1-ethynylcyclohexan-1-ol (an amount that was 100 ppm in terms of mass unit relative to the amount of the present composition).

The hardness and the degree of discoloration of the cured product of this curable silicone composition were measured. Furthermore, the reliability test was performed for an optical device produced by using this curable silicone composition. These results are shown in Table 1.

Example 3

A curable silicone composition was prepared by mixing 50.2 parts by mass of organopolysiloxane that contained 6.5 mass % of vinyl group and that was represented by the average unit formula:

$(Me_3SiO_{2/2})_{0.02}(ViMeSiO_{2/2})_{0.28}(PhSiO_{3/2})_{0.70}$
$(HO_{1/2})_{0.02}$, 10.0 parts by mass of organopolysiloxane that contained 2.0 mass % of vinyl group and that was represented by the average unit formula:

$(ViMe_2SiO_{1/2})_{0.10}(PhMeSiO_{2/2})_{0.90}(HO_{1/2})_{0.02}$, 9.9 parts by mass of organopolysiloxane that contained 0.32 mass % of silicon atom-bonded hydrogen atom and that was represented by the average formula:

$Me_2HSiO(SiPh_2O)_{2.5}SiMe_2H$ (in an amount that silicon atom-bonded hydrogen atoms in the present component was 1.00 mol per 1 mol of the vinyl groups in the two types of organopolysiloxanes described above), 1,3-divinyl-1,1,3,3-tetramethyldisiloxane solution of platinum-1,3-divinyl-1,1,3,3-tetramethyldisiloxane complex (an amount so that the amount of platinum metal, in terms of mass unit, relative to the amount of the present composition was 5.5 ppm), and 1-ethynylcyclohexan-1-ol (an amount that was 100 ppm in terms of mass unit relative to the amount of the present composition).

The hardness and the degree of discoloration of the cured product of this curable silicone composition were measured. Furthermore, the reliability test was performed for an optical device produced by using this curable silicone composition. These results are shown in Table 1.

Example 4

A curable silicone composition was prepared by mixing 56.2 parts by mass of organopolysiloxane that contained 6.5 mass % of vinyl group and that was represented by the average unit formula:

$(Me_3SiO_{2/2})_{0.02}(ViMeSiO_{2/2})_{0.28}(PhSiO_{3/2})_{0.70}$
$(HO_{1/2})_{0.02}$, 10.0 parts by mass of organopolysiloxane that contained 2.0 mass % of vinyl group and that was represented by the average unit formula:

$(ViMe_2SiO_{1/2})_{0.10}(PhMeSiO_{2/2})_{0.90}(HO_{1/2})_{0.02}$, 3.8 parts by mass of organopolysiloxane that contained 0.32 mass % of silicon atom-bonded hydrogen atom and that was represented by the average formula:

$Me_2HSiO(SiPh_2O)_{2.5}SiMe_2H$ (in an amount that silicon atom-bonded hydrogen atoms in the present component was 1.00 mol per 1 mol of the vinyl groups in the two types of organopolysiloxanes described above), 1,3-divinyl-1,1,3,3-tetramethyldisiloxane solution of platinum-1,3-divinyl-1,1,3,3-tetramethyldisiloxane complex (an amount so that the amount of platinum metal, in terms of mass unit, relative to the amount of the present composition was 5.5 ppm), and 1-ethynylcyclohexan-1-ol (an amount that was 100 ppm in terms of mass unit relative to the amount of the present composition).

The hardness and the degree of discoloration of the cured product of this curable silicone composition were measured. Furthermore, the reliability test was performed for an optical device produced by using this curable silicone composition. These results are shown in Table 1.

Example 5

A curable silicone composition was prepared by mixing 67.3 parts by mass of organopolysiloxane that contained 6.5 mass % of vinyl group and that was represented by the average unit formula:

$(Me_3SiO_{2/2})_{0.02}(ViMeSiO_{2/2})_{0.28}(PhSiO_{3/2})_{0.70}$
$(HO_{1/2})_{0.02}$, 10.0 parts by mass of organopolysiloxane that contained 2.0 mass % of vinyl group and that was represented by the average unit formula:

$(ViMe_2SiO_{1/2})_{0.10}(PhMeSiO_{2/2})_{0.90}(HO_{1/2})_{0.02}$, 22.7 parts by mass of organopolysiloxane that contained 0.60 mass % of silicon atom-bonded hydrogen atom and that was represented by the formula:

$Ph_2Si(OSiMe_2H)_2$ (in an amount that silicon atom-bonded hydrogen atoms in the present component was 1.00 mol per 1 mol of the vinyl groups in the two types of organopolysiloxanes described above), 1,3-divinyl-1,1,3,3-tetramethyldisiloxane solution of platinum-1,3-divinyl-1,1,3,3-tetramethyldisiloxane complex (an amount so that the amount of platinum metal, in terms of mass unit, relative to the amount of the present composition was 5.5 ppm), and 1-ethynylcyclohexan-1-ol (an amount that was 100 ppm in terms of mass unit relative to the amount of the present composition).

The hardness and the degree of discoloration of the cured product of this curable silicone composition were measured. Furthermore, the reliability test was performed for an optical device produced by using this curable silicone composition. These results are shown in Table 1.

Example 6

A curable silicone composition was prepared by mixing 70.6 parts by mass of organopolysiloxane that contained 6.5 mass % of vinyl group and that was represented by the average unit formula:

$(Me_3SiO_{2/2})_{0.02}(ViMeSiO_{2/2})_{0.28}(PhSiO_{3/2})_{0.70}$
$(HO_{1/2})_{0.02}$, 29.4 parts by mass of organopolysiloxane that contained 0.60 mass % of silicon atom-bonded hydrogen atom and that was represented by the formula:

$Ph_2Si(OSiMe_2H)_2$ (in an amount that silicon atom-bonded hydrogen atoms in the present component was 1.1 mol per 1 mol of the vinyl group in the organopolysiloxane described above), 1,3-divinyl-1,1,3,3-tetramethyldisiloxane solution of platinum-1,3-divinyl-1,1,3,3-tetramethyldisiloxane complex (an amount so that the amount of platinum metal, in terms of mass unit, relative to the amount of the present composition was 5.5 ppm), and 1-ethynylcyclohexan-1-ol (an amount that was 100 ppm in terms of mass unit relative to the amount of the present composition).

The hardness and the degree of discoloration of the cured product of this curable silicone composition were measured. Furthermore, the reliability test was performed for an optical device produced by using this curable silicone composition. These results are shown in Table 1.

Example 7

A curable silicone composition was prepared by mixing 49.4 parts by mass of organopolysiloxane that contained 6.5 mass % of vinyl group and that was represented by the average unit formula:

$(Me_3SiO_{2/2})_{0.02}(ViMeSiO_{2/2})_{0.28}(PhSiO_{3/2})_{0.70}$
$(HO_{1/2})_{0.02}$, 30.0 parts by mass of organopolysiloxane that contained 2.0 mass % of vinyl group and that was represented by the average unit formula:

$(ViMe_2SiO_{1/2})_{0.10}(PhMeSiO_{2/2})_{0.90}(HO_{1/2})_{0.02}$, 23.2 parts by mass of organopolysiloxane that contained 0.60 mass % of silicon atom-bonded hydrogen atom and that was represented by the formula:

$Ph_2Si(OSiMe_2H)_2$ (in an amount that silicon atom-bonded hydrogen atoms in the present component was 0.8 mol per 1 mol of the vinyl groups in the two types of organopolysiloxanes described above), 1,3-divinyl-1,1,3,3-tetramethyldisiloxane solution of platinum-1,3-divinyl-1,1,3,3-tetramethyldisiloxane complex (an amount so that the amount of platinum metal, in terms of mass unit, relative to the amount of the present composition was 4.0 ppm), and 1-ethynylcyclohexan-1-ol (an amount that was 100 ppm in terms of mass unit relative to the amount of the present composition).

The hardness and the degree of discoloration of the cured product of this curable silicone composition were measured. Furthermore, the reliability test was performed for an optical device produced by using this curable silicone composition. These results are shown in Table 1.

TABLE 1

|  | Examples | | | | | | |
|---|---|---|---|---|---|---|---|
|  | 1 | 2 | 3 | 4 | 5 | 6 | 7 |
| Type D durometer hardness | 66 | 60 | 54 | 52 | 73 | 30 | 64 |
| Degree of discoloration b* of cured product | | | | | | | |
| Initial | 0.1 | 0.1 | 0.1 | 0.1 | 0.1 | 0.1 | 0.1 |
| After heating at 180° C. for 240 hours | 1.3 | 1.4 | 1.3 | 1.4 | 1.4 | 1.4 | 1.4 |
| Retention rate of light radiant flux (%) | 98 | 100 | 99 | 97 | 98 | 98 | 100 |

Example 8

When the curable silicone composition prepared in Example 1 was heated at 120° C. for 20 minutes, a curable hot-melt silicone that was non-flowable at 25° C. and had low surface stickiness was obtained. The melt viscosity at 50° C. of this curable hot-melt silicone was 8060 Pa·s, and the melt viscosity at 100° C. of this curable hot-melt silicone was 180 Pa·s. The degree of conversion in the reaction was 65%. Furthermore, when this curable hot-melt silicone was heated at 180° C., the curable hot-melt silicone was once melted and then cured to obtain a cured product having no hot melt properties within 5 minutes.

The hardness and the degree of discoloration of the cured product of this curable hot-melt silicone were measured. Furthermore, the reliability test was performed for an optical device produced by using this curable hot-melt silicone. These results are shown in Table 2.

Example 9

When the curable silicone composition prepared in Example 2 was heated at 120° C. for 30 minutes, a curable hot-melt silicone that was non-flowable at 25° C. and had low surface stickiness was obtained. The melt viscosity at 50° C. of this curable hot-melt silicone was 10100 Pa·s, and the melt viscosity at 100° C. of this curable hot-melt silicone was 100 Pa·s. The degree of conversion in the reaction was 66%. Furthermore, when this curable hot-melt silicone was heated at 180° C., the curable hot-melt silicone was once melted and then cured to obtain a cured product having no hot melt properties within 5 minutes.

The hardness and the degree of discoloration of the cured product of this curable hot-melt silicone were measured. Furthermore, the reliability test was performed for an optical device produced by using this curable hot-melt silicone. These results are shown in Table 2.

Example 10

When the curable silicone composition prepared in Example 3 was heated at 120° C. for 20 minutes, a curable hot-melt silicone that was non-flowable at 25° C. and had low surface stickiness was obtained. The melt viscosity at 50° C. of this curable hot-melt silicone was 12000 Pa·s, and the melt viscosity at 100° C. of this curable hot-melt silicone was 3050 Pa·s. The degree of conversion in the reaction was 73%. Furthermore, when this curable hot-melt silicone was heated at 180° C., the curable hot-melt silicone was once melted and then cured to obtain a cured product having no hot melt properties within 5 minutes.

The hardness and the degree of discoloration of the cured product of this curable hot-melt silicone were measured. Furthermore, the reliability test was performed for an optical device produced by using this curable hot-melt silicone. These results are shown in Table 2.

Example 11

When the curable silicone composition prepared in Example 4 was heated at 120° C. for 10 minutes, a curable hot-melt silicone that was non-flowable at 25° C. and had low surface stickiness was obtained. The melt viscosity at 50° C. of this curable hot-melt silicone was 2580 Pa·s, and the melt viscosity at 100° C. of this curable hot-melt silicone was 27 Pa·s. The degree of conversion in the reaction was 70%. Furthermore, when this curable hot-melt silicone was heated at 180° C., the curable hot-melt silicone was once melted and then cured to obtain a cured product having no hot melt properties within 5 minutes.

The hardness and the degree of discoloration of the cured product of this curable hot-melt silicone were measured. Furthermore, the reliability test was performed for an optical device produced by using this curable hot-melt silicone. These results are shown in Table 2.

Example 12

When the curable silicone composition prepared in Example 5 was heated at 120° C. for 10 minutes, a curable hot-melt silicone that was non-flowable at 25° C. and had low surface stickiness was obtained. The melt viscosity at 50° C. of this curable hot-melt silicone was 10400 Pa·s, and the melt viscosity at 100° C. of this curable hot-melt silicone was 152 Pa·s. The degree of conversion in the reaction was 74%. Furthermore, when this curable hot-melt silicone was heated at 180° C., the curable hot-melt silicone was once melted and then cured to obtain a cured product having no hot melt properties within 5 minutes.

The hardness and the degree of discoloration of the cured product of this curable hot-melt silicone were measured. Furthermore, the reliability test was performed for an optical device produced by using this curable hot-melt silicone. These results are shown in Table 2.

Example 13

When the curable silicone composition prepared in Example 6 was heated at 120° C. for 10 minutes, a hot melt silicone that was non-flowable at 25° C. and had low surface stickiness was obtained. The melt viscosity at 50° C. of this curable hot-melt silicone was 12200 Pa·s, and the melt viscosity at 100° C. of this curable hot-melt silicone was 158 Pa·s. The degree of conversion in the reaction was 60%. When this curable hot-melt silicone was heated at 180° C., the curable hot-melt silicone was once melted and then cured to obtain a cured product having no hot melt properties within 5 minutes.

The hardness and the degree of discoloration of the cured product of this curable hot-melt silicone were measured. Furthermore, the reliability test was performed for an optical device produced by using this curable hot-melt silicone. These results are shown in Table 2.

Example 14

When the curable silicone composition prepared in Example 7 was heated at 120° C. for 10 minutes, a curable hot-melt silicone that was non-flowable at 25° C. and had low surface stickiness was obtained. The melt viscosity at 50° C. of this curable hot-melt silicone was 12700 Pa·s, and the melt viscosity at 100° C. of this curable hot-melt silicone was 3400 Pa·s. The degree of conversion in the reaction was 58%. Furthermore, when this curable hot-melt silicone was heated at 180° C., the curable hot-melt silicone was once melted and then cured to obtain a cured product having no hot melt properties within 5 minutes.

The hardness and the degree of discoloration of the cured product of this curable hot-melt silicone were measured. Furthermore, the reliability test was performed for an optical device produced by using this curable hot-melt silicone. These results are shown in Table 2.

TABLE 2

| | Examples | | | | | | |
|---|---|---|---|---|---|---|---|
| | 8 | 9 | 10 | 11 | 12 | 13 | 14 |
| Type D durometer hardness | 65 | 60 | 54 | 53 | 73 | 31 | 64 |
| Degree of discoloration b* of cured product | | | | | | | |
| Initial | 0.1 | 0.1 | 0.1 | 0.1 | 0.1 | 0.1 | 0.1 |
| After heating at 180° C. for 240 hours | 1.3 | 1.4 | 1.3 | 1.4 | 1.4 | 1.4 | 1.4 |
| Retention rate of light radiant flux (%) | 99 | 99 | 99 | 97 | 99 | 98 | 100 |

Comparative Example 1

A curable silicone composition was prepared by mixing 71.7 parts by mass of organopolysiloxane that contained 4.9 mass % of vinyl group and that was represented by the average unit formula:

$(ViMeSiO_{2/2})_{0.25}(Ph_2SiO_{2/2})_{0.30}(PhSiO_{3/2})_{0.45}(HO_{1/2})_{0.02}$, 10.0 parts by mass of organopolysiloxane that contained 2.0 mass % of vinyl group and that was represented by the average unit formula:

$(ViMe_2SiO_{1/2})_{0.10}(PhMeSiO_{2/2})_{0.90}(HO_{1/2})_{0.02}$, 18.3 parts by mass of organopolysiloxane that contained 0.75 mass % of silicon atom-bonded hydrogen atom and that was represented by the formula:

$PhMeSi(OSiMe_2H)_2$ (in an amount that silicon atom-bonded hydrogen atoms in the present component was 1.00 mol per 1 mol of the vinyl groups in the two types of organopolysiloxanes described above), 1,3-divinyl-1,1,3,3-tetramethyldisiloxane solution of platinum-1,3-divinyl-1,1,3,3-tetramethyldisiloxane complex (an amount so that the amount of platinum metal, in terms of mass unit, relative to the amount of the present composition was 1 ppm), and 1-ethynylcyclohexan-1-ol (an amount that was 100 ppm in terms of mass unit relative to the amount of the present composition).

The hardness and the degree of discoloration of the cured product of this curable silicone composition were measured. Furthermore, the reliability test was performed for an optical device produced by using this curable silicone composition. These results are shown in Table 3.

Comparative Example 2

A curable silicone composition was prepared by mixing 67.8 parts by mass of organopolysiloxane that contained 4.9 mass % of vinyl group and that was represented by the average unit formula:

$(ViMeSiO_{2/2})_{0.10}(Me_2SiO_{2/2})_{0.15}(PhSiO_{3/2})_{0.75}$
$(HO_{1/2})_{0.03}$, 20.0 parts by mass of organopolysiloxane that contained 2.0 mass % of vinyl group and that was represented by the average unit formula:

$(ViMe_2SiO_{1/2})_{0.10}(PhMeSiO_{2/2})_{0.90}(HO_{1/2})_{0.02}$, 18.3 parts by mass of organopolysiloxane that contained 0.60 mass % of silicon atom-bonded hydrogen atom and that was represented by the formula:

$Ph_2Si(OSiMe_2H)_2$ (in an amount that silicon atom-bonded hydrogen atoms in the present component was 1.00 mol per 1 mol of the vinyl groups in the two types of organopolysiloxanes described above), 1,3-divinyl-1,1,3,3-tetramethyldisiloxane solution of platinum-1,3-divinyl-1,1,3,3-tetramethyldisiloxane complex (an amount so that the amount of platinum metal, in terms of mass unit, relative to the amount of the present composition was 1 ppm), and 1-ethynylcyclohexan-1-ol (an amount that was 100 ppm in terms of mass unit relative to the amount of the present composition).

The hardness and the degree of discoloration of the cured product of this curable silicone composition were measured. Furthermore, the reliability test was performed for an optical device produced by using this curable silicone composition. These results are shown in Table 3.

Comparative Example 3

A curable silicone composition was prepared by mixing 64.0 parts by mass of organopolysiloxane that contained 4.9 mass % of vinyl group and that was represented by the average unit formula:

$(ViMeSiO_{2/2})_{0.10}(Me_2SiO_{2/2})_{0.15}(PhSiO_{3/2})_{0.75}$
$(HO_{1/2})_{0.03}$, 10.0 parts by mass of organopolysiloxane that contained 2.0 mass % of vinyl group and that was represented by the average unit formula:

$(ViMe_2SiO_{1/2})_{0.10}(PhMeSiO_{2/2})_{0.90}(HO_{1/2})_{0.02}$, 26.0 parts by mass of organopolysiloxane that contained 0.60 mass % of silicon atom-bonded hydrogen atom and that was represented by the formula:

$Ph_2Si(OSiMe_2H)_2$ (in an amount that silicon atom-bonded hydrogen atoms in the present component was 1.00 mol per 1.26 mol of the vinyl groups in the two types of organopolysiloxanes described above), 1,3-divinyl-1,1,3,3-tetramethyldisiloxane solution of platinum-1,3-divinyl-1,1,3,3-tetramethyldisiloxane complex (an amount so that the amount of platinum metal, in terms of mass unit, relative to the amount of the present composition was 1 ppm), and 1-ethynylcyclohexan-1-ol (an amount that was 100 ppm in terms of mass unit relative to the amount of the present composition).

The hardness and the degree of discoloration of the cured product of this curable silicone composition were measured. Furthermore, the reliability test was performed for an optical device produced by using this curable silicone composition. These results are shown in Table 3.

Comparative Example 4

A curable silicone composition was prepared by mixing 76.0 parts by mass of organopolysiloxane that contained 4.9 mass % of vinyl group and that was represented by the average unit formula:

$(ViMeSiO_{2/2})_{0.25}(Me_2SiO_{2/2})_{0.20}(PhSiO_{3/2})_{0.55}$
$(HO_{1/2})_{0.01}$, 24.0 parts by mass of organopolysiloxane that contained 2.0 mass % of vinyl group and that was represented by the average unit formula:

$(ViMe_2SiO_{1/2})_{0.10}(PhMeSiO_{2/2})_{0.90}(HO_{1/2})_{0.02}$, 27.0 parts by mass of organopolysiloxane that contained 0.60 mass % of silicon atom-bonded hydrogen atom and that was represented by the formula:

$Ph_2Si(OSiMe_2H)_2$ (in an amount that silicon atom-bonded hydrogen atoms in the present component was 1.00 mol per 1 mol of the vinyl groups in the two types of organopolysiloxanes described above), 1,3-divinyl-1,1,3,3-tetramethyldisiloxane solution of platinum-1,3-divinyl-1,1,3,3-tetramethyldisiloxane complex (an amount so that the amount of platinum metal, in terms of mass unit, relative to the amount of the present composition was 1 ppm), and 1-ethynylcyclohexan-1-ol (an amount that was 100 ppm in terms of mass unit relative to the amount of the present composition).

The hardness and the degree of discoloration of the cured product of this curable silicone composition were measured. Furthermore, the reliability test was performed for an optical device produced by using this curable silicone composition. These results are shown in Table 3.

Comparative Example 5

When the curable silicone composition prepared in Comparative Example 2 was heated at 120° C. for 5 minutes, 10 minutes, and 15 minutes, a cured product was obtained in all the cases and it was found that hot melt properties were not achieved.

Comparative Example 6

When the curable silicone composition prepared in Comparative Example 4 was heated at 120° C. for 5 minutes, 10 minutes, and 15 minutes, a cured product was obtained in all the cases and it was found that hot melt properties were not achieved.

TABLE 3

|  | Comparative Example | | | |
|---|---|---|---|---|
|  | 1 | 2 | 3 | 4 |
| Type D durometer hardness | 68 | 45 | 69 | 55 |
| Degree of discoloration b* of cured product | | | | |
| Initial | 0.1 | 0.1 | 0.1 | 0.1 |
| After heating at 180° C. for 240 hours | 3.1 | 2.2 | 2.4 | 2.4 |
| Retention rate of light radiant flux (%) | 12 | 30 | 20 | 32 |

INDUSTRIAL APPLICABILITY

Since the curable silicone composition of the present invention provides a cured product having excellent light resistance and heat resistance, the curable silicone composition is suitable for applications that require durability, such as optical devices. Furthermore, since the curable hot-melt silicone of the present invention is non-flowable at 25° C., has low surface stickiness and, by being cured, provides a cured product having excellent light resistance and heat resistance similar to those of the cured product obtained from the curable silicone composition described above after being easily melted by heating. Therefore, the curable hot-melt silicone is suitable for sealing materials, hot-melt adhesives, and the like of semiconductor devices that require heat resistance and light resistance. Furthermore, since the curable hot-melt silicone of the present invention has curability in addition to hot melt properties, the curable hot-melt silicone is suitable for applications that require durability. Furthermore, the optical device of the present invention is suitable for an optical device required to have high durability since, in the optical device of the present invention, an optical semiconductor element is encapsulated, protected, or covered with the silicone cured product having excellent light resistance and heat resistance.

REFERENCE SIGNS LIST

1 Substrate
2 LED
3 Convex cured product
4 Reflective member

The invention claimed is:

1. A curable silicone composition comprising:
(A) 100 parts by mass of an organopolysiloxane represented by the average unit formula:

$(R^1{}_3SiO_{1/2})_a(R^2{}_2SiO_{2/2})_b(R^3SiO_{3/2})_c(SiO_{4/2})_d(R^4O_{1/2})_e$ wherein,
$R^1$, $R^2$, and $R^3$ are the same or different and are each a phenyl group, an alkyl group having from 1 to 6 carbons, or an alkenyl group having from 2 to 6 carbons;
provided that, 40 mol % or less of $R^1$, 30 mol % or greater of $R^2$, and 10 mol % or less of $R^3$ are alkenyl groups, and 30 to 60 mol % of the total of $R^1$, $R^2$, and $R^3$ are phenyl groups;
$R^4$ is a hydrogen atom or an alkyl group having from 1 to 6 carbons; and
"a" is a number of 0 to 0.2, "b" is a number of 0.2 to 0.5, "c" is a number of 0.3 to 0.8, "d" is a number of 0 to 0.5, "e" is a number of 0 to 0.1, "c+d" is a number of 0.3 to 0.8, and "a+b+c+d" is 1;
(B) from 0 to 150 parts by mass of an organopolysiloxane represented by the average unit formula:

$(R^5{}_3SiO_{1/2})_f(R^5{}_2SiO_{2/2})_g(R^5SiO_{3/2})_h(SiO_{4/2})_i(R^6O_{1/2})_j$ wherein,
$R^5$ are the same or different and are each a phenyl group, an alkyl group having from 1 to 6 carbons, or an alkenyl group having from 2 to 6 carbons;
provided that, 10 to 70 mol % of all $R^5$ are phenyl groups, and at least one of all $R^5$ is an alkenyl group;
$R^6$ is a hydrogen atom or an alkyl group having from 1 to 6 carbons; and
"f" is a number of 0.01 to 0.3, "g" is a number of 0.4 to 0.99, "h" is a number of 0 to 0.2, "i" is a number of 0 to 0.2, "j" is a number of 0 to 0.1, "h+i" is a number of 0 to 0.2, and "f+g+h+i" is 1;
(C) an organohydrogenpolysiloxane represented by the average composition formula:

$R^7{}_k H_l SiO_{(4-k-l)/2}$ wherein,
$R^7$ is a phenyl group or an alkyl group having from 1 to 6 carbons;
provided that, 10 to 70 mol % of all $R^7$ are phenyl groups; and
"k" is a number of 1.0 to 2.5, "l" is a number of 0.01 to 0.9, and "k+l" is a number of 1.5 to 3.0; and
wherein component (C) is present in an amount such that silicon atom-bonded hydrogen atoms in component (C) is from 0.5 to 2.0 mol per 1 mol of the total alkenyl groups in components (A) and (B); and
(D) a hydrosilylation catalyst in an amount sufficient to accelerate hydrosilylation reaction of the composition.

2. The curable silicone composition according to claim 1, further comprising (E) from 0.0001 to 5 parts by mass of a reaction inhibitor per 100 parts by mass of the total amount of components (A) to (D).

3. An optical device comprising an optical semiconductor element that is encapsulated, protected, or covered with a cured product of the curable silicone composition according to claim 1.

4. The curable silicone composition according to claim 1, wherein component (B) is present in the composition.

5. The curable silicone composition according to claim 1, wherein component (A) is an organopolysiloxane in which 35 to 55 mol % of the total of $R^1$, $R^2$, and $R^3$ are phenyl groups.

6. A curable hot-melt silicone that is non-flowable at 25° C. and that has a melt viscosity at 100° C. of 5000 Pa·s or less, wherein the curable hot melt silicon is formed by subjecting a curable silicone composition to a hydrosilylation reaction to a degree that does not form a cured product, and wherein the curable silicone composition comprises:
(A) 100 parts by mass of an organopolysiloxane represented by the average unit formula:

$(R^1{}_3SiO_{1/2})_a(R^2{}_2SiO_{2/2})_b(R^3SiO_{3/2})_c(SiO_{4/2})_d(R^4O_{1/2})_e$ wherein,
$R^1$, $R^2$, and $R^3$ are the same or different and are each a phenyl group, an alkyl group having from 1 to 6 carbons, or an alkenyl group having from 2 to 6 carbons;

provided that, 40 mol % or less of $R^1$, 30 mol % or greater of $R^2$, and 10 mol % or less of $R^3$ are alkenyl groups, and 30 to 60 mol % of the total of $R^1$, $R^2$, and $R^3$ are phenyl groups;

$R^4$ is a hydrogen atom or an alkyl group having from 1 to 6 carbons; and

"a" is a number of 0 to 0.2, "b" is a number of 0.2 to 0.5, "c" is a number of 0 to 0.8, "d" is a number of 0 to 0.5, "e" is a number of 0 to 0.1, "c+d" is a number of 0.3 to 0.8, and "a+b+c+d" is 1;

(B) from 0 to 40 parts by mass of an organopolysiloxane represented by the average unit formula:

$(R^5{}_3SiO_{1/2})_f(R^5{}_2SiO_{2/2})_g(R^5SiO_{3/2})_h(SiO_{4/2})_i(R^6O_{1/2})_j$ wherein,

$R^5$ are the same or different and are each a phenyl group, an alkyl group having from 1 to 6 carbons, or an alkenyl group having from 2 to 6 carbons;

provided that, 10 to 70 mol % of all $R^5$ are phenyl groups, and at least one of all $R^5$ is an alkenyl group;

$R^6$ is a hydrogen atom or an alkyl group having from 1 to 6 carbons; and

"f" is a number of 0.01 to 0.3, "g" is a number of 0.4 to 0.99, "h" is a number of 0 to 0.2, "i" is a number of 0 to 0.2, "j" is a number of 0 to 0.1, "h+i" is a number of 0 to 0.2, and "f+g+h+i" is 1;

(C) an organohydrogenpolysiloxane represented by the average composition formula:

$R^7{}_k H_l SiO_{(4-k-l)/2}$ wherein, $R^7$ is a phenyl group or an alkyl group having from 1 to 6 carbons;

provided that, 10 to 70 mol % of all $R^7$ are phenyl groups;

"k" is a number of 1.0 to 2.5, "l" is a number of 0.01 to 0.9, and "k+l" is a number of 1.5 to 3.0; and wherein component (C) is present in an amount such that silicon atom-bonded hydrogen atoms in component (C) is from 0.5 to 2.0 mol per 1 mol of the total alkenyl groups in components (A) and (B); and (D) a hydrosilylation catalyst in an amount sufficient to accelerate hydrosilylation reaction of the composition.

7. The curable hot-melt silicone according to claim 6, wherein the curable silicone composition further comprises (E) from 0.0001 to 5 parts by mass of a reaction inhibitor per 100 parts by mass of the total amount of components (A) to (D).

8. The curable hot-melt silicone according to claim 7, wherein the degree of conversion in the hydrosilylation reaction is from 50% to 90%.

9. The curable hot-melt silicone according to claim 7, in the form of a sheet, powder, or tablet.

10. The curable hot-melt silicone according to claim 6, in the form of a sheet, powder, or tablet.

11. The curable hot-melt silicone according to claim 6, wherein component (B) is present in the composition.

12. The curable hot-melt silicone according to claim 6, wherein the degree of conversion in the hydrosilylation reaction is from 50% to 90%.

13. An optical device comprising an optical semiconductor element that is encapsulated, protected, or covered with the curable hot-melt silicone according to claim 6.

14. The curable hot-melt silicone according to claim 6, wherein component (A) is an organopolysiloxane in which 35 to 55 mol % of the total of $R^1$, $R^2$, and $R^3$ are phenyl groups.

* * * * *